(12) United States Patent
Dewey, III et al.

(10) Patent No.: US 6,574,782 B1
(45) Date of Patent: Jun. 3, 2003

(54) DECOUPLED CAPACITANCE CALCULATOR FOR ORTHOGONAL WIRING PATTERNS

(75) Inventors: L. William Dewey, III, Wappingers Falls, NY (US); Peter A. Habitz, Hinesburg, VT (US); Thomas G. Mitchell, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 09/713,422

(22) Filed: Nov. 15, 2000

(51) Int. Cl.[7] .............................................. G06F 17/50
(52) U.S. Cl. .............................................. 716/5; 716/4
(58) Field of Search ............................... 716/4–6, 8–12

(56) References Cited

U.S. PATENT DOCUMENTS

| | | |
|---|---|---|
| 5,452,224 A | 9/1995 | Smith, Jr. et al. |
| 5,706,206 A | 1/1998 | Hammer et al. |
| 5,761,080 A | 6/1998 | DeCamp et al. |
| 5,838,582 A | 11/1998 | Mehrotra et al. |
| 5,923,565 A | 7/1999 | Smith et al. |
| 6,185,722 B1 * | 2/2001 | Darden et al. .............. 716/5 |

* cited by examiner

Primary Examiner—Vuthe Siek
Assistant Examiner—Naum Levin
(74) Attorney, Agent, or Firm—McGinn & Gibb, PLLC; Richard M. Kotulak, Esq.

(57) ABSTRACT

A structure and method for extracting parasitic capacitance from a multi-layer wiring structure that creates, for each wiring layer in a wiring structure, a wiring density map and measures a plurality of metal segments in a wiring layer to determine an area occupied by the metal segments. The invention calculates an up area capacitance component for each of the metal segments by multiplying the area occupied by the metal segments by a wiring density from the wiring density map of an overlying wiring layer over the metal segments and by a capacitance coefficient of the overlying wiring layer. To calculate the down area capacitance component for each of the metal segments, the invention multiplies the area occupied by the metal segments by a wiring density, from the wiring density map of an underlying wiring layer under the metal segments and by a capacitance coefficient of the underlying wiring layer. The invention combines the up area capacitance component and the down area capacitance component to form a vertical coupling capacitance component for each of the metal segments.

21 Claims, 3 Drawing Sheets

DECOUPLED CAPACITANCE CALCULATOR FOR ORTHOGONAL WIRING PATTERNS

BACKGROUND OF THE INVENTION

1. Field of the Invention

The present invention generally relates to methods and systems that calculate ("extract") the parasitic capacitance that will be exhibited by an integrated circuit design and more particularly to an improved method of determining parasitic capacitance that reduces the computational burden when compared to conventional systems.

2. Description of the Related Art

With the high cost of tooling and manufacturing integrated circuit devices, designers prefer to prepare and test models of the integrated circuit prior to actual manufacturing production. An actual physical model of the integrated circuit structure can be constructed. However, it is preferable to evaluate the design itself to determine if it complies with various rules (such as ground rules, minimum spacing rules, etc.) and to estimate whether the circuit will perform as the designers intended. This testing is preferably performed by software utilizing a computer simulation. With such a system, a physical model does not need to be created and the design can be easily incrementally improved as problems are revealed during the testing stage.

One aspect of testing integrated circuit designs involves extracting the capacitance between various conductors and insulators within the integrated circuit. Many integrated circuit structures comprise multi-layer or laminated structures that have multiple parallel wiring levels that are interconnected with conductive vias. Insulators prevent short circuits between adjacent layers and between wiring within a single layer. These various conductors and insulators have a capacitance value that changes depending upon the size and number of wires and the thickness of the insulators.

When evaluating the capacitance of a single wire of a very large scale integrated (VLSI) design belonging to a single level, most wires above and below will be orthogonal (perpendicular in the xy-plane) to the given wire. Typically, a parasitic capacitance extraction program will find all of the overlapping wires above and below the given wire to get a reasonable approximation of the capacitive coupling above and below. Lateral coupling is typically found by measuring the spacing to the nearest neighboring wires of the same level possibly including the effect of the nearest wires above and below the lateral coupling wire pair.

All these small capacitance contributions are then added to result in capacitances per wire segments. However, the calculations required to extract the capacitance of each wiring element in such conventional systems produces a large burden upon the computing overhead and results in a lengthy computing process. Therefore, there is a need to reduce the computational overhead and excessive computational time associate with conventional capacitance extraction systems.

SUMMARY OF THE INVENTION

It is, therefore, an object of the present invention to provide a structure and method for extracting parasitic capacitance from a multi-layer wiring structure that creates, for each wiring layer in a wiring structure, a wiring density map and measures a plurality of metal segments in a wiring layer to determine an area occupied by the metal segments.

The invention calculates an up area capacitance component for each of the metal segments by multiplying the area occupied by the metal segments by a wiring density from the wiring density map of an overlying wiring layer over the metal segments and by a capacitance coefficient of the overlying wiring layer. To calculate the down area capacitance component for each of the metal segments, the invention multiplies the area occupied by the metal segments by a wiring density, from the wiring density map of an underlying wiring layer under the metal segments and by a capacitance coefficient of the underlying wiring layer. The invention combines the up area capacitance component and the down area capacitance component to form a vertical coupling capacitance component for each of the metal segments.

The invention also calculates an up fringe capacitance component using an average distance between the overlying layer and the metal segments and a distance between adjacent metal segments in the wiring layer. The invention similarly calculates a down fringe capacitance component using an average distance between the underlying layer and the metal segments and a distance between adjacent metal segments in the wiring layer. The invention ties the vertical capacitance component, the up fringe capacitance component and the down fringe capacitance component to ground to produce an overall area capacitance.

The invention can also calculate a lateral coupling capacitance using an average distance between the overlying layer and the metal segments, an average distance between the underlying layer and the metal segments, and a distance between adjacent metal segments in the wiring layer. The invention ties the coupling capacitance to networks within the wiring layer to produce an overall coupling capacitance. The invention combines the overall area capacitance and the overall coupling capacitance with a resistance of each of the metal segments to produce a distributed coupled network capacitance.

In another embodiment, the invention partitions the wiring layer, the overlying layer, and the underlying layer into equal two-dimensional areas wherein the calculating of the up area capacitance component, the down area capacitance component, the fringe up capacitance component, the fringe down capacitance component and the lateral capacitance component for the metal segments within each of the areas. For metal segments that occupy more than one of the two-dimensional areas, the invention divides the metal segments into a plurality of conductive segments, each occupying at least a portion of the two-dimensional areas and determines the overall area capacitance. The overall coupling capacitance for each of the conductive segments are calculated as segment coupling capacitances. The invention sums the segment coupling capacitances to produce an overall coupling capacitance of each of the metal segments.

The inventive system for extracting parasitic capacitance from a multi-layer wiring structure includes a mapping unit adapted to partition a first layer and a second layer of the wiring structure into a plurality of two-dimensional areas (the first layer is adjacent the second layer), a density scale adapted to determine a wiring density of a first two-dimensional area in the first layer, and a capacitance coupler adapted to determine an average coupling capacitance coefficient of the first two-dimensional area relative to a corresponding second two-dimensional area in the second layer. A size calculator measures a size of a conductive element within the second two-dimensional area and a mathematical unit multiplies the size of the conductive element by the wiring density and by the coupling capacitance coefficient to determine a coupling capacitance between the first layer and the second layer for the conductive element.

The capacitance coupler determines a second average coupling capacitance coefficient of the second two-dimensional area relative to a corresponding third two-dimensional area in a third layer. The third layer is adjacent the second layer and on an opposite side of the second layer from the first layer. The density scale further determines a wiring density of the third area, and the mathematical unit further multiplies the size of the conductive element by the wiring density of the third area and by the second average coupling capacitance coefficient to produce a second coupling capacitance. The mathematical also combines the coupling capacitance and the second coupling capacitance. Further, the first area, the second area, and the third area have identical dimension and the mathematical unit determines the coupling capacitance of all conductive elements in the second area.

If the conductive element occupies more than one area in the second layer of the wiring structure, the mapping unit divides the conductive element into a plurality of conductive segments, each occupying at least a portion of the areas. The capacitance coupler determines the coupling capacitance for each of the conductive segments as segment coupling capacitances and the mathematical unit sums the segment coupling capacitances to produce an overall coupling capacitance of the conductive element.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
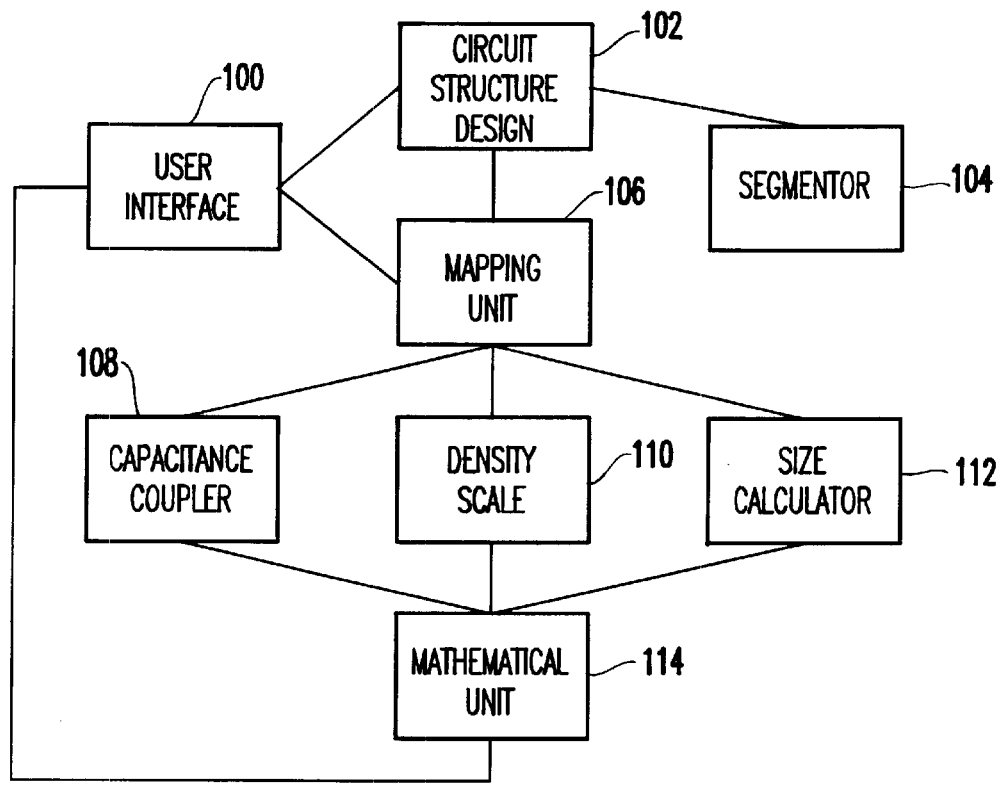
FIG. 1 is a schematic diagram of a system for determining coupling capacitance according to the invention.

This invention solves the conventional problems with determining capacitance by using local shape density values to approximate the area of overlap of levels above and below the given wire. Also, the invention uses shape density (of levels above and below) to determine fairly accurate lateral coupling values. This allows the invention to have a much faster run time compared to the conventional systems that actually determine overlapping shape areas, without much loss in accuracy. The invention is especially useful for VLSI global wiring, where successive wiring levels are orthogonal. Further, with the invention, there are fewer computer storage requirements to calculate capacitances.

Local density queries are available in most conventional VLSI layout shape processing engines. The invention uses these density queries to independently calculate a density map for each wiring level. The density map may be based on boxes as fine as ten microns or smaller. Several technology parameters, most notably the bias of a shape and the thickness of the conductor, are significantly dependent on the local pattern density of this layer. Therefore, it is already necessary to calculate the local pattern density of every conductor level and apply the appropriate capacitance table values and bias values as function of the density of the square in which the origin of the segment is located. Thus, the invention does not add significant additional effort to calculate and tabulate the pattern density in advance.

Conventionally, the capacitance of a piece of wire is expressed of a sum of capacitances up, coupling this wire to nets on the layers above, capacitances caused by horizontally running field lines coupling to nets on the same layer, and capacitances coupling to nets on layers underneath. Furthermore, the capacitance up and down are broken up in area and perimeter components. All up and down components depend on the distance between the originating wire and the conductor above or underneath, respectively, and the lateral or horizontal component on both the distance to the conductor above and the distance to the conductor below.

Following a wire segment in orthogonal wire systems the vertical distance to the wires above changes very frequently with every crossing wire, creating a close distance for the length of the wire width above and larger vertical distance with the length of a wire space. This creates a tremendous amount of small capacitance components, which need to be evaluated for an accurate calculation. The invention simplifies this situation significantly.

The invention first takes advantage of the fact that capacitances to single nets above will not cause significant coupling. The single terms for crossings between orthogonal wires are small and become significant only due to their large number for the wire under consideration. It is therefore possible to tie all the nodes of capacitances to nets above together into one global capacitance "ground" net. This allows the invention to add all capacitances ending on nets above and underneath. To the contrary, lateral capacitances between nets on the same layer can have significantly long common runs, resulting in important coupling capacitances. Therefore the lateral capacitance cannot be lumped together. The invention merges very small coupling capacitance into a net on "ground" and maintains all larger coupling capacitances individually. Therefore, without loss of accuracy, the invention can be applied to problems requiring coupling capacitance, like noise analysis.

In the next step, the invention adds all capacitances to nets on levels above or underneath by creating an average environment. This is equivalent to creating a virtual metal plate at a specified distance to the metal segment under consideration. Instead of calculating all the small up-down capacitance components and adding them up to a total capacitance per segment, the invention creates an average environment and evaluates the capacitance in this simplified geometry.

The distance hv of these virtual plates to the wire under consideration is a function of the density of shapes over or underneath, and the type of capacitance component to be evaluated. The distance is calculated to match the average capacitance of crossing wires with the given density on each level above or underneath. For example the area component above CAa:

$$CAa(hv)=d1*CAa(ha1)+d2*CAa(ha2)+$$

Here d1 and d2 are the density of shapes on one or two levels above the wire under consideration and $CAa(ha1)$ and $CAa(ha2)$ are the area components of the capacitances respectively. The capacitance CAa is then fitted as function of the density parameters d1, d2. Also the capacitances CAb to the conductors below are fitted to the appropriate densities below.

Lateral capacitances and the fringe up and down capacitances depend on the distance to the next conductor on the same level and also on the distance to the virtual metal plate above and underneath. For these capacitances, the distance to the virtual plate hv is then fitted as a function of the density d1, d2. As the importance of the vertical distance also depends on the lateral distance, an average lateral distance is used that weighs the sensitivities of the capacitance components to the vertical conductor distance when calculating lateral capacitance. In this way for each of the capacitance components a different fit of the pattern density describes the capacitance components or the distance of the virtual metal plate to the wire segment under consideration.

The conceptual basis for the invention can be seen in the following example. If a wire is short, its footprint will be contained in a roughly constant density regions of the level above and below. Long wires can cross multiple dissimilar density regions. The invention effectively breaks up the longer wires into smaller wires and the capacitances are summed up for each of the smaller regions.

Thus, the invention dispenses with the need to individually calculate the vertical coupling capacitance between the actual wires contained within different levels. Instead, the invention utilizes a wiring density and the coupling capacitance and multiplies the same by the area occupied by a specific structure to extract that structure's vertical capacitance values. By looking at the coupling capacitance and wiring density of an area (as opposed to specific wiring patterns), the number and complexity of calculations are substantially reduced. This allows the invention to achieve increased speed and reduced computational overhead when compared to conventional systems.

The performance advantage comes from avoiding calculating shape overlap. The conventional shape overlap calculation is typically expensive (both performance and storage) since long wires overlap many other orthogonal wires. The use of local wiring density, above and below, makes this method more accurate than one assuming constant density (e.g., all wires at minimum pitch).

As mentioned above, for lateral (vertical face to vertical face of same level) and fringe (vertical face to horizontal face of level above or below) coupling, the invention makes adjustments to the effective dielectric thickness based upon the average local density values. These adjustment values can also be determined by obtaining best fit parameters to accurately calculated values, as would be known to one ordinarily skilled in the art given this disclosure. Then, also having the spacing measurements for the wire, a conformal mapping equation, for instance, can be used to determine lateral and fringe capacitance values.

In one embodiment of the invention, the area of vias is subtracted from the total area of the wire to give a more realistic "upward vertical coupling area" for the wire. This features, in general, result in two effective areas per wire, one upward, and one downward and lateral.

As explained above, the invention is especially useful for integrated circuit structures where all wires on different layers are orthogonal because in such structures no net to net coupling can accumulate between adjacent layers. The invention also finds preferred use where all coupling capacitance is between parallel lines on the same metal level; metal lines of the same net on adjacent levels are connected on vias and have beyond this no significant interaction; the average length of a metal segment is about the size of local pattern density; and the pattern density changes smoothly across the area of interest.

The invention parameterizes the capacitance calculations according to pattern density for each technology. Conventional capacitance extraction applications have tables of values for each process corner for dielectric distance, area capacitance, fringe to area capacitance, and fringe to fringe capacitance. The invention replaces each table with a fit to a function dependent on the pattern density over or under each level. The fit is generated during the technology file generation process and therefore does not impact extraction performance.

Figure 2:
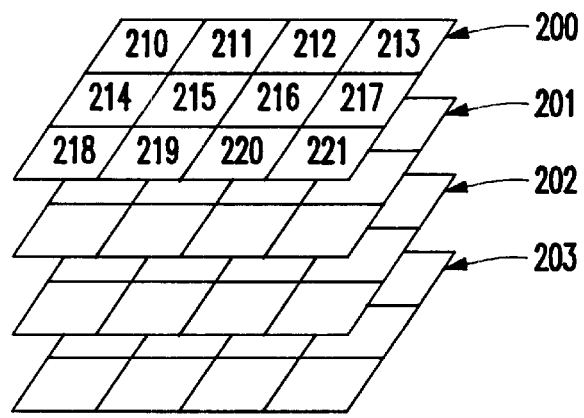
FIG. 2 is an exploded schematic diagram of a multi-layer wiring structure as divided by the invention.

Referring now to the drawings, FIG. 1 illustrates the inventive system for extracting parasitic capacitance from a multi-layer wiring structure and FIG. 2 illustrates an exploded view of a multi-layer wiring structure.

The system includes a graphic user interface 100, such as a personal computer or network terminal. The user creates a circuit design 102 using the graphic user interface 100. The circuit design 102 creates the multi-layer wiring structure shown in FIG. 2.

A mapping unit 106 divides the layers 200–203 of the wiring structure into a plurality of two-dimensional areas 210–211. Each layer 200–203 is similarly divided. If a conductive element occupies more than one area in a layer of the wiring structure, a segmentor 104 divides the conductive element into a plurality of conductive segments, one for each of the areas.

A density scale 110 determines the wiring density of one of the areas and a capacitance coupler 108 determines a coupling capacitance coefficient of each area relative to other areas in adjacent layers. The size calculator 112 measures the size of the conductive element (or conductive segment). A mathematical unit 114 multiplies the size of the conductive element by the wiring density and the capacitance coefficient to determine a coupling capacitance of the conductive element and outputs the same through the graphic user interface 100.

The capacitance coupler 108 determines an upward coupling capacitance coefficient for one area and the area above and a downward coupling capacitance coefficient for the area below. The mathematical unit 114 multiplies the size of the conductive element by the wiring density and the upward capacitance coefficient to determine the upward coupling capacitance and multiplies the size of the conductive element by the wiring density and the downward capacitance coefficient to determine the downward coupling capacitance of the conductive element.

Figure 3:
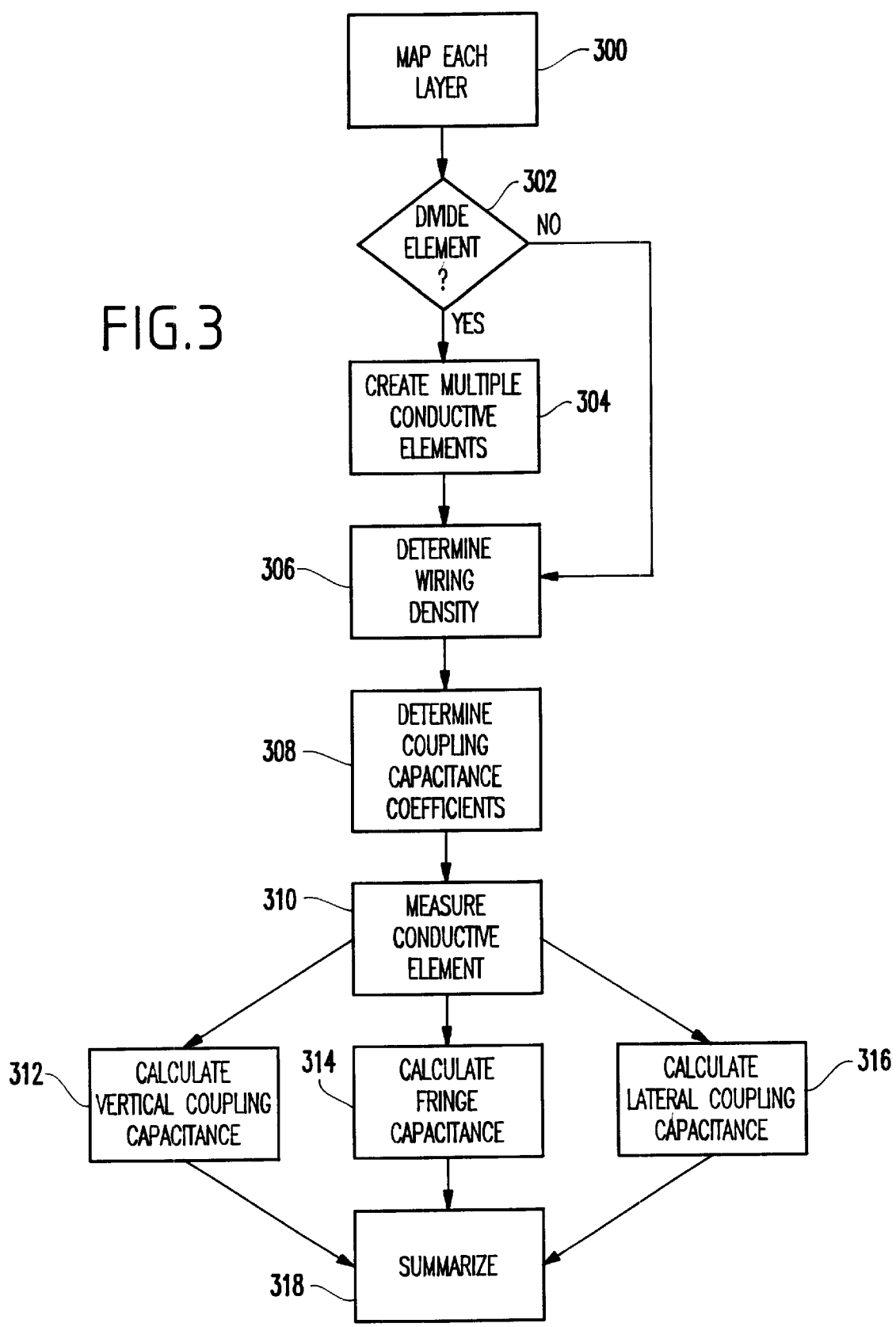
FIG. 3 is a flowchart illustrating one embodiment of the invention.

FIG. 3 illustrates a flowchart of the processing performed by the invention. More specifically, in item 300 the invention divides each layer 200–203 of the wiring structure into a plurality of two-dimensional areas 210–221. As shown in item 302, if any conductive element occupies more than one area, the invention divides the conductive element into a plurality of conductive segments in item 304, one for each area. Then in item 306, the invention determines the wiring density of the areas and determines the coupling capacitance coefficient of each area relative to other areas in adjacent layers (item 308). As shown in item 310, the invention measures the size of the conductive elements within each area. In item 312, the invention multiplies the size of the conductive element by the wiring density and the capacitance coefficient to determine a coupling capacitance of each conductive element. In item 314, the invention summarizes the coupling capacitance of each of the elements within an area and/or summarizes the coupling capacitances of different segments of a conductive element that was divided into segments in item 304.

More specifically, in item 308, the invention determines the upward coupling capacitance coefficient between one area and the area above it and determines the downward coupling capacitance coefficient between the area and the area below it. In item 312, the invention multiplies the size of the conductive element by the wiring density and the upward capacitance coefficient to determine the upward coupling capacitance of the conductive element and multiplies the size of the conductive element by the wiring density and the downward capacitance coefficient to determine the downward coupling capacitance of the conductive element.

Figure 4:
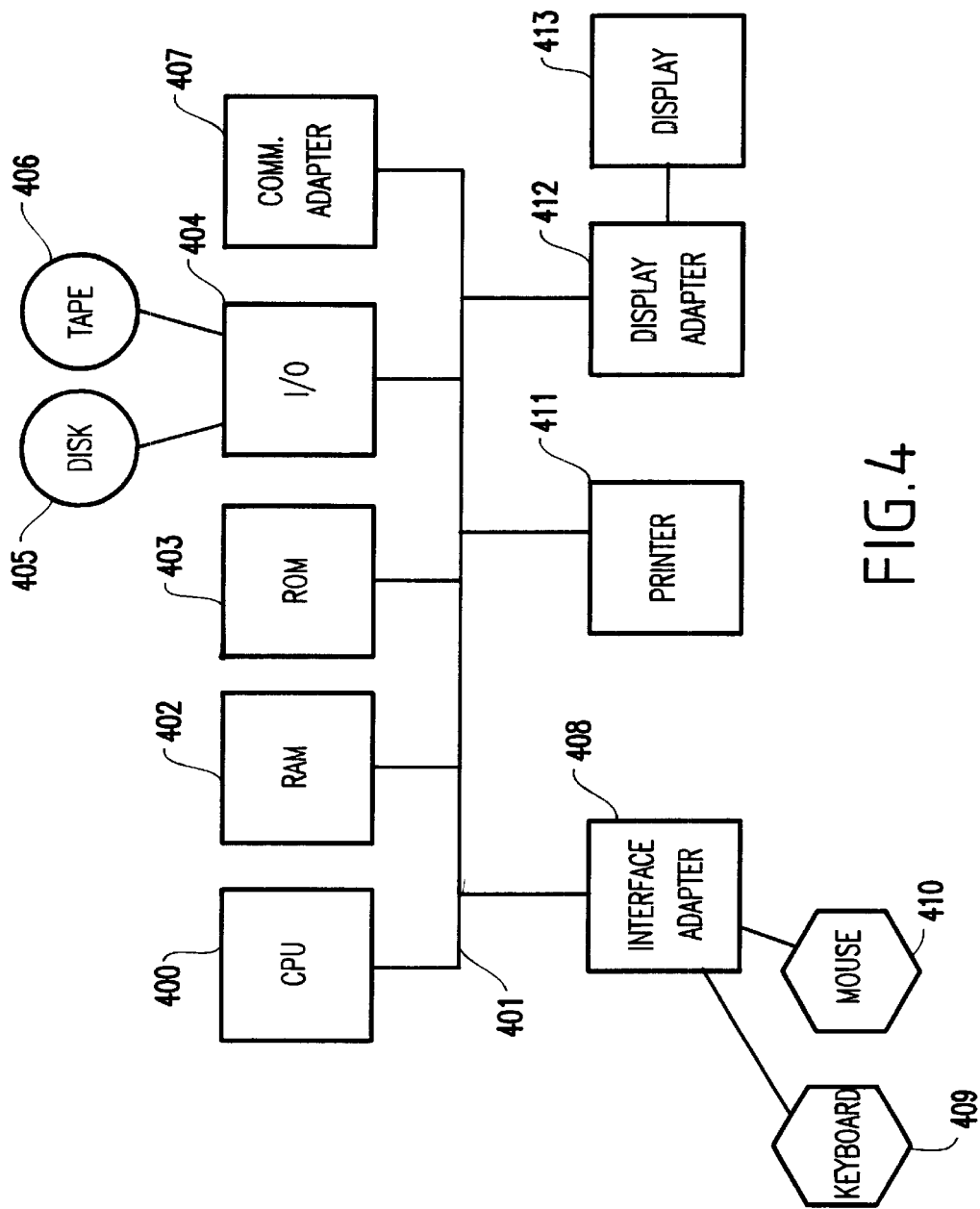
FIG. 4 is a hardware embodiment of the invention.

While the overall methodology of the invention is described above, the invention can be embodied in any number of different types of systems and executed in any number of different ways, as would be known by one ordinarily skilled in the art. For example, as illustrated in FIG. 4, a typical hardware configuration of an information handling/computer system in accordance with the invention preferably has at least one processor or central processing unit (CPU) 400. For example, the central processing unit 400 could include various processing units, mapping units, weighting units, classification units, clustering units, filters, adders, subtractors, comparators, etc. Alternatively, as would be known by one ordinarily skilled in the art given this disclosure, multiple specialized CPU's (or other similar individual functional units) could perform the same processing, mapping, weighting, classifying, clustering, morphing, filtering, adding, subtracting, comparing, etc.

The CPU 400 is interconnected via a system bus 401 to a random access memory (RAM) 402, read-only memory (ROM) 403, input/output (I/O) adapter 404 (for connecting peripheral devices such as disk units 405 and tape drives 406 to the bus 401), communication adapter 407 (for connecting an information handling system to a data processing network) user interface adapter 408 (for connecting a peripherals 409–411 such as a keyboard, mouse, imager, microphone, speaker and/or other interface device to the bus 401), a printer 412, and display adapter 413 (for connecting the bus 401 to a display device 414). The invention could be implemented using the structure shown in FIG. 4 by including the inventive method, described above, within a computer program stored on the storage device 405. Such a computer program would act on information supplied through the interface units 409–411 or through the network connection 407. The system would then automatically perform the above processing and output the same on the display 414, through the printer 412 or back to the network 407.

The invention determines the local pattern density on every level in the interleaved regions of about 50 um or smaller and stores this information. The invention extracts parasitic capacitance from a multi-layer wiring structure by first creating, for each wiring level in the wiring structure, a wiring density map. Then, the invention measures, for each metal segment in each wiring level, an area occupied by each of the metal segments. Next, the invention calculates the up area capacitance component (Cup) using a pattern density of a level over each of the metal segments, and the down area capacitance component (Cdown) for each of the metal segments using a pattern density of a level under each of the metal segments.

In a similar manner, the invention calculates the up fringe capacitance component using an average distance to the level over each of the metal segments, and the down fringe capacitance component using an average distance to the level under each of the metal segments.

The invention then ties the up area capacitance, the up fringe capacitance, the down area capacitance, and the down fringe capacitance to ground to produce an overall area capacitance. The invention also calculates the coupling capacitance using the up area capacitance component (Cup), the down area capacitance component (Cdown), and a lateral capacitance components based upon a distance to an adjacent metal structure within a single level of the wiring structure and a thickness of the adjacent metal structure.

Then, the invention similarly ties the lateral coupling capacitance to the networks of the level of the metal segments while all capacitances to networks on the level over each of the metal segments are tied to capacitive "ground".

Finally, the invention combines the overall area capacitance and the overall coupling capacitance with a resistance of each of the metal segments to produce a distributed coupled network capacitance. The resistor network had been calculated before in conventional methods, and is correlated to the capacitance network as described, using the net and node names of the design.

Understanding of the quality of the approach can be gained by considering that the invention effectively middles all capacitances from one wire segment by creating an effective medium environment. This is equivalent to the conventional method of adding all components for the segment, but much more efficient.

Thus, the invention produces the following advantages. The up, down, and line to line capacitance are decoupled in the sense that they do not have to be broken into regions of a constant environment. The number of terms to be calculated for every segment is significantly reduced. This leads to large (a factor of 2–7) improvement in performance without significant loss of accuracy. The method has been especially successful in applications of large random logic macros.

While the invention has been described in terms of preferred embodiments, those skilled in the art will recognize that the invention can be practiced with modification within the spirit and scope of the appended claims.

What is claimed is:

1. A method of extracting parasitic capacitance from a multi-layer wiring structure comprising:

creating, for each wiring layer in said wiring structure, a wiring density map;

measuring, for each of a plurality of metal segments in a wiring layer, an area occupied by each of said metal segments;

calculating an up area capacitance component for each of said metal segments by multiplying said area occupied by said metal segments by a wiring density, from said wiring density map, of an overlying wiring layer over said metal segments and by a capacitance coefficient of said overlying wiring layer;

calculating a down area capacitance component for each of said metal segments by multiplying said area occupied by said metal segments by a wiring density, from said wiring density map, of an underlying wiring layer under said metal segments and by a capacitance coefficient of said underlying wiring layer; and combining said up area capacitance component and said down area capacitance component to form a vertical coupling capacitance component for each of said metal segments.

2. The method in claim 1, further comprising:

calculating an up fringe capacitance component using an average distance between said overlying layer and said metal segments and a distance between adjacent metal segments in said wiring layer; and calculating a down fringe capacitance component using an average distance between said underlying layer and said metal segments and a distance between adjacent metal segments in said wiring layer.

3. The method in claim 2, further comprising tying said vertical capacitance component, said up fringe capacitance component, and said down fringe capacitance component to ground to produce an overall area capacitance.

4. The method in claim 3, further comprising:

calculating a lateral coupling capacitance using an average distance between said overlying layer and said metal segments, an average distance between said underlying layer and said metal segments, and a distance between adjacent metal segments in said wiring layer; and tying said coupling capacitance to networks within said wiring layer to produce an overall coupling capacitance.

5. The method in claim 4, further comprising combining said overall area capacitance and said overall coupling capacitance with a resistance of each of said metal segments to produce a distributed coupled network capacitance.

6. The method in claim 5, further comprising partioning said wiring layer, said overlying layer, and said underlying layer into equal two-dimensional areas, wherein said calculating of said up area capacitance component, said down area capacitance component, said fringe up capacitance component, said fringe down capacitance component, and said lateral capacitance component is performed for said metal segments within each of said areas.

7. The method in claim 6, wherein, for ones of said metal segments that occupy more than one of said two-dimensional areas, said method further comprising:

dividing said metal segments into a plurality of conductive segments, each occupying at least a portion of said two-dimensional areas;

determining said overall area capacitance and said overall coupling capacitance for each of said conductive segments as segment coupling capacitances; and summing said segment coupling capacitances to produce an overall coupling capacitance of each of said ones of said metal segments.

8. A method of extracting parasitic capacitance from a multi-layer wiring structure comprising:

partitioning a first layer and a second layer of said wiring structure into a plurality of two-dimensional areas, wherein said first layer is adjacent said second layer;

determining a wiring density of a first two-dimensional area in said first layer;

determining an average coupling capacitance coefficient of said first two-dimensional area relative to a corresponding second two-dimensional area in said second layer;

measuring a size of a conductive element within said second two-dimensional area; and multiplying said size of said conductive element by said wiring density and by said coupling capacitance coefficient to determine a coupling capacitance between said first layer and said second layer for said conductive element.

9. The method in claim 8, wherein said determining of said average capacitance coefficient further comprises determining a second average coupling capacitance coefficient of said second two-dimensional area relative to a corresponding third two-dimensional area in a third layer, wherein said third layer is adjacent said second layer and on an opposite side of said second layer from said first layer.

10. The method in claim 9, wherein said multiplying further comprises multiplying said size of said conductive element by a wiring density of said third area and by said second average coupling capacitance coefficient to produce a second coupling capacitance.

11. The method in claim 10, further comprising combining said coupling capacitance and said second coupling capacitance.

12. The method in claim 9, wherein said first area, said second area, and said third area have identical dimensions.

13. The method in claim 8, further comprising determining said coupling capacitance of all conductive elements in said second area.

14. The method in claim 8, wherein said conductive element occupies more than one area in said second layer of said wiring structure, said method further comprising:

dividing said conductive element into a plurality of conductive segments, each occupying at least a portion of said areas;

determining said coupling capacitance for each of said conductive segments as segment coupling capacitances; and summing said segment coupling capacitances to produce an overall coupling capacitance of said conductive element.

15. A system for extracting parasitic capacitance from a multi-layer wiring structure comprising:

a mapping unit adapted to partition a first layer and a second layer of said wiring structure into a plurality of two-dimensional areas, wherein said first layer is adjacent said second layer;

a density scale adapted to determine a wiring density of a first two-dimensional area in said first layer;

a capacitance coupler adapted to determine an average coupling capacitance coefficient of said first two-dimensional area relative to a corresponding second two-dimensional area in said second layer;

a size calculator adapted to measure a size of a conductive element within said second two-dimensional area; and a mathematical unit adapted to multiply said size of said conductive element by said wiring density and by said coupling capacitance coefficient to determine a coupling capacitance between said first layer and said second layer for said conductive element.

16. The system in claim 15, wherein said capacitance coupler is further adapted to determine a second average coupling capacitance coefficient of said second two-dimensional area relative to a corresponding third two-dimensional area in a third layer, wherein said third layer is adjacent said second layer and on an opposite side of said second layer from said first layer.

17. The system in claim 16, wherein said density scale is further adapted to determine a wiring density of said third area, and said mathematical unit is further adapted to multiply said size of said conductive element by said wiring density of said third area and by said second average coupling capacitance coefficient to produce a second coupling capacitance.

18. The system in claim 17, wherein said mathematical unit is further adapted to combine said coupling capacitance and said second coupling capacitance.

19. The system in claim 16, wherein said first area, said second area, and said third area have identical dimensions.

20. The system in claim 15, wherein said mathematical unit is further adapted to determine said coupling capacitance of all conductive elements in said second area.

21. The system in claim 15, wherein:

said conductive element occupies more than one area in said second layer of said wiring structure, said mapping unit is further adapted to divide said conductive element into a plurality of conductive segments, each occupying at least a portion of said areas;

said capacitance coupler is further adapted to determine said coupling capacitance for each of said conductive segments as segment coupling capacitances; and said mathematical unit is further adapted to sum said segment coupling capacitances to produce an overall coupling capacitance of said conductive element.

* * * * *